United States Patent [11] 3,584,306

[72] Inventor George Ctirad Spacek
967 La Senda Road, Santa Barbara, Calif. 93015
[21] Appl. No. 668,718
[22] Filed Sept. 18, 1967
[45] Patented June 8, 1971

[54] HIGH FREQUENCY CONVERTER
4 Claims, 3 Drawing Figs.

[52] U.S. Cl. .................... 325/446, 321/69, 325/449
[51] Int. Cl. .................... H03d 7/10
[50] Field of Search .................... 325/442, 445, 446, 449; 329/161; 321/69; 333/11

[56] References Cited

UNITED STATES PATENTS

| | | | |
|---|---|---|---|
| 3,414,833 | 12/1968 | Tolliver | 330/53 |
| 2,576,481 | 11/1951 | Rodwin | 325/446 |
| 2,727,986 | 12/1955 | Pascalar | 325/446 |
| 3,071,729 | 1/1963 | Schiffman | 325/446 |
| 3,169,224 | 2/1965 | Butson | 325/446 |
| 3,350,649 | 10/1967 | Blaeser | 325/449 |

*Primary Examiner*—Robert L. Griffin
*Assistant Examiner*—Benedict V. Safourek

ABSTRACT: This invention relates to a balanced high frequency converter for mixing of microwave signals over large bandwidth. The essential characteristics of this invention are the placement of semiconductor diodes at the intersection of a waveguide with two coaxial lines in such manner that the broad walls of the waveguide are utilized as the continuation of the outer conductors of the coaxial lines. Thus the waveguide does not cause an impedance mismatch for input signals propagating on the two coaxial lines, allowing coupling of input signals at any frequencies to the diodes. The resulting beat frequency signal, generated in the semiconductor diodes, is extracted through the waveguide.

Inventor: George Ctirad Spacek

Inventor: George Ctirad Spacek

HIGH FREQUENCY CONVERTER

This invention relates in general to frequency converters and more particularly to high frequency converters employing semiconductor diodes in a balanced configuration. Balanced frequency converters are usually employed in superheterodyne microwave receivers, for which the signal frequency is so high that amplification at the signal frequency is technically or economically not feasible. The frequency converter changes the signal frequency to an intermediate frequency, which carries the same information as the signal, but is at a much lower frequency, at which amplification is technically and economically feasible. For many applications the information bandwidth is narrow and consequently the bandwidth of the frequency converter does not have to be wide. For this purpose, balanced frequency converters are existing which consist of a pair of semiconductor diodes placed on the opposite arms of a microwave hybrid junction, commonly referred to as hybrid Tee. The distance between the two diodes in the hybrid Tee is large relatively to the wavelength of the signal and intermediate frequency and consequently the bandwidth of a frequency converter with hybrid Tee is narrow. This is so because the long length of transmission lines connecting the two diodes acts as additional reactance, which narrows down the bandwidth of the conventional hybrid Tee frequency converter. This effect is more enhanced by the fact that the impedance of semiconductor diodes varies with frequency, such that the transmission lines connecting the two diodes cannot be matched in impedance to the diodes over a large bandwidth. As is generally known, a transmission line connected to a mismatched load will act as an impedance transformer, the transformation effect of which is the larger, the longer is the transmission line in terms of wavelengths. For transmission length line length negligible to wavelength no transformation effect exists, while for a transmission line length equal to multiples of quarter wavelength maximum impedance transformation will result. Thus if signal frequency or intermediate frequency is so high that the length of of transmission lines connecting the two diodes in a conventional, hybrid Tee frequency converter approaches one-quarter wavelength, it is not possible to obtain good conversion efficiency over a wide band of frequencies, because the impedance of the transmission lines will vary with respect to frequency. The presently existing balanced frequency converters with hybrid Tee can therefore be used only for applications in which frequency conversion over only a narrow bandwidth is required. For some applications, however, the information bandwidth is very wide. This applies especially for noise receivers, commonly referred to as microwave radiometer receivers, and to some type of surveillance receivers. Additionally, for some applications frequency converters are used not only for downconversion, as is the case in a superheterodyne receiver, but also for upconversion, where the intermediate frequency is higher than the RF signal frequency. In this case a large fractional RF signal bandwidth is reduced to a narrower fractional bandwidth at the intermediate frequency, while the absolute bandwidth remains the same. The advantage of such an arrangement is that intermediate frequency amplifiers with narrow fractional bandwidth can be used to amplify RF signals over large absolute bandwidth.

It is an object of this invention to provide a novel type of frequency converter, in which the bandwidth limitations of a conventional, hybrid Tee frequency converter are avoided by placing the two semiconductor diodes immediately next to each other.

It is another object of this invention to provide a wideband frequency converter in which the transmission lines for the RF signal, local oscillator and intermediate frequency are substantially decoupled from each other so that neither signal will couple into the transmission line provided for the other signal.

The present invention includes two separate transmission line structures, a waveguide transmission line and a TEM coaxial transmission line. The waveguide transmission line is used to extract the intermediate frequency signal from the semiconductor diodes, while the TEM coaxial transmission lines transmit the RF signal and the local oscillator signal to the semiconductor diodes. The wave paths provided by each of these structures cross at a common point in such a manner that neither of the signals to be mixed will be conducted by the transmission provided for the other signal.

The two semiconductor diodes are placed at the intersection of the two transmission line structures, thus allowing coupling of the RF and local oscillator signals to the diodes and extracting intermediate frequency signal out of the semiconductor diodes. Mixing of the signals is accomplished by periodical resistance variation of the diodes as caused by the local oscillator voltage. The semiconductor diodes can also be of the variable reactance variety, commonly referred to as varactor diodes.

The respective polarity of the semiconductor diodes is such that the RF and local oscillator signals excite each diode with 180° phase difference with respect to the other diode, while the intermediate frequency signals emerging from the two diodes are in phase. The 180° phase difference at the local oscillator and RF signal frequencies prevents these signals from propagating into the intermediate frequency transmission line and vice versa.

Since both semiconductor diodes are located immediately next to each other, no additional transmission lines are required to combine the intermediate frequency signals emerging from each diode. Similarly, only one transmission line common for both diodes is needed to couple the RF and local oscillator signals into the diodes.

Other features and objects of the invention will be apparent from the following specific description of embodiments taken in conjunction with the FIGS. in which.

Figure 1:
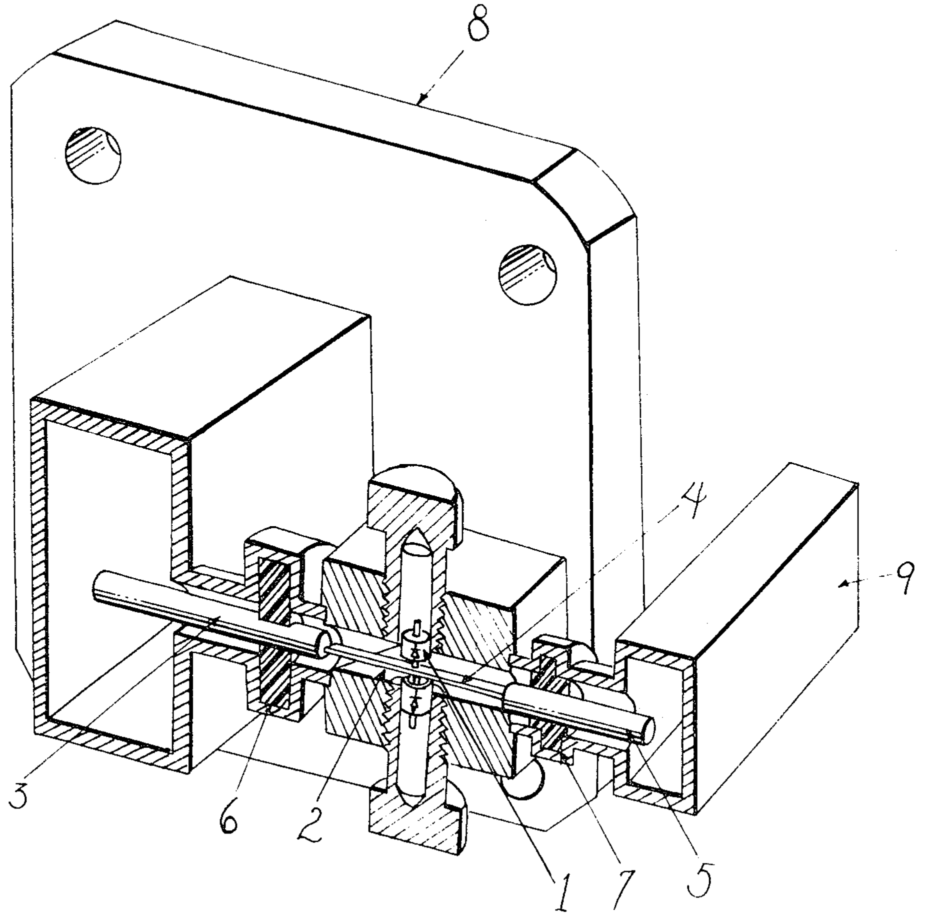
FIG. 1 illustrates an isometric view of the frequency converter, including waveguide to coaxial transitions, filters, diode mounting units and other secondary details which would be included in an operational model of the frequency converter but which are not necessarily essential to this invention.
Figure 2:
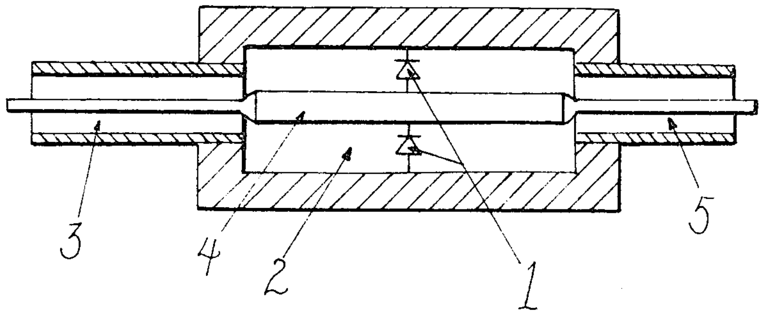
FIG. 2 illustrates a front-sectional view of the frequency converter, with only the essential features of this invention shown but with all secondary details of an operational unit omitted.
Figure 3:
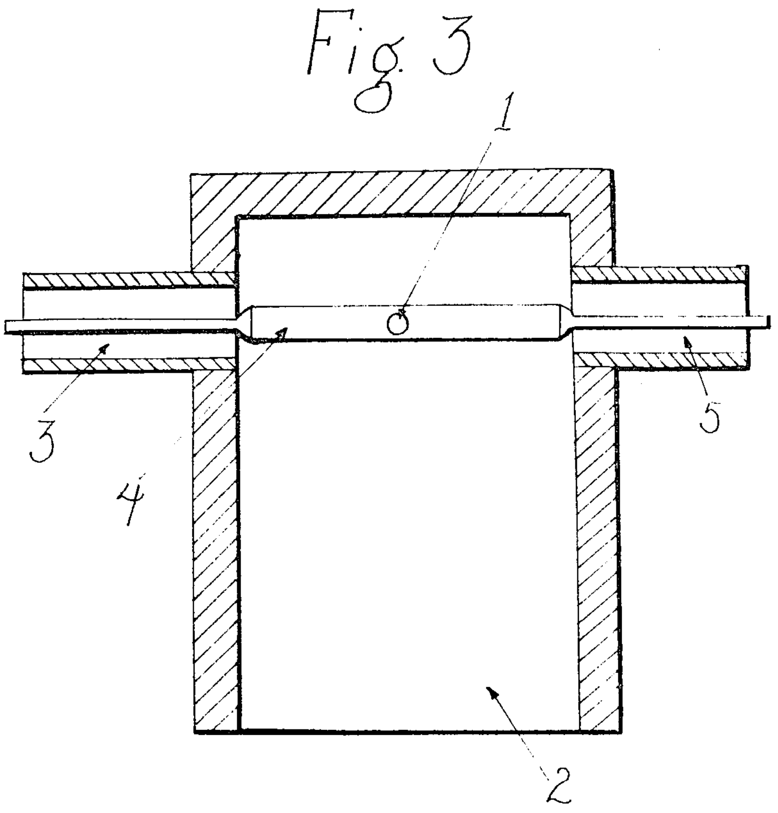
FIG. 3 illustrates a top view of the frequency converter, with only the essential features of this invention shown but with all secondary details of an operational unit omitted.

FIGS. 1—3 illustrate an embodiment of the invention including semiconductor diodes for mixing of two signals which, for convenience, will be hereinafter referred to as RF signal and LO signal to produce a third signal referred to as IF signal. Although the abbreviation IF signal implies a frequency intermediate between the RF and LO signals, for the purpose of this invention an IF signal might be equal to the difference of the frequencies of the RF and LO signals, (commonly called lower sideband) but it might also be equal to the sum of the frequencies of the RF and LO signals (commonly called upper sideband). In this case the IF signal will be at a frequency higher than either the RF and LO signal.

As shown in FIG. 1, a pair of semiconductor diodes 1 is placed within a waveguide 2, which serves to extract the IF signal emerging from each diode and transmit it to the IF Amplifier, which can be thought of as being connected to the waveguide between the observer and the illustration. Prior art in frequency converters has shown devices similar to the one described in this application but in which the IF signal was extracted by a coaxial, rather than waveguide transmission line. As the described invention relates to frequency converters with either very high intermediate frequency or to frequency upconverters, it is advantageous to extract the IF signal through a waveguide rather than coaxial line. A waveguide acts as a high pass filter, such that no loss of RF signal through leakage of the IF waveguide is possible, because for converters with very high intermediate frequency or for upconverters the RF signal is at lower frequency than the IF signal. The elimination of leakage of RF signal into the IF terminal results in better conversion efficiency of the frequency converter described in this application. Additionally, the bandwidth performance is also improved, because the electrical balance of the semiconductor diodes, which is difficult to obtain over a large bandwidth, is not the only means of eliminating the RF signal from propagating into the IF port, as is the case when coaxial line is used to extract the IF signal.

The IF signal is generated in the semiconductor diodes through interaction of the LO and RF signals, the mechanism being nonlinear characteristics of the diodes with respect to the LO signal amplitude. The LO signal is coupled to the diodes through coaxial line 5 which is changed at the junction with the waveguide 2 into the stripline 4. The stripline continues through the waveguide and is changed on the other side of the waveguide into coaxial line 3, which serves to couple the RF signal to the diodes. In addition to these essential elements of the invention, FIG. 1 shows reject filter 6, which passes the RF signal but rejects the LO signal, and reject filter 7 which passes the LO signal but rejects the RF signal. Although these filters would normally be included in an operational unit of the frequency converter, they are not essential to the invention as these filters could in principle be built-in into the generator of the RF and LO signal. FIG. 1 shows also waveguide flange 8 to which the generator of RF signal would normally be connected, and waveguide 9 to which the generator of LO signal would normally be connected. However, if the generators of RF and LO signal are provided with coaxial output terminals, they can be connected directly to coaxial lines 3 and 5, respectively. Waveguide 8 and waveguide 9 are therefore not essential to the invention and their inclusion in FIG. 1 serves merely to depict a most typical environment for this type of microwave frequency converter.

The conversion mechanism of the frequency converter shown in FIG. 1 is as follows:

The LO signal generator connected to axial line 5 excites via stripline 4 the semiconductor diodes 1 with 180° phase difference, as each diode is in opposite direction with respect to the electric field vectors of the LO signal. The diodes are simultaneously excited via stripline 4 by the RF signal generator, which is connected to coaxial line 3. The two diodes are excited by the RF voltage with 180° phase difference with respect to each other. A mathematical analysis would show that under these conditions the IF signals emerging from the diodes are in phase and they will not therefore couple to the coaxial line, but only to the waveguide 2, which serves as the IF output transmission line. Similarly, if the electrical characteristics of the two diodes are equal at the RF and LO frequency, these signals cannot propagate into the waveguide 2, if the lower cutoff frequency of this waveguide is higher than the frequency of the RF or LO signal. For an upper sideband upconverter both the RF and LO signals are at lower frequency than the IF signal. For a lower sideband upconverter only the RF signal is at lower frequency than the IF signal.

FIG. 2 is a cross-sectional view and FIG. 3 is the top view of the frequency converter, with only the essential elements shown. All elements shown in FIGS. 2 and 3 are the same as in FIG. 1, with the exception of the TEM transmission line 4. In FIG. 1 this line is shown as stripline 4, while in FIGS. 2 and 3 this transmission line consists of a cylindrical center conductor 4 and of parallel-plates outer conductor, formed by the top and bottom walls of waveguide 2. Such a transmission line, commonly referred to as slab line, is more advantageous than a stripline if one of the signals is at such a high frequency that its wavelength approaches one-half circumferential dimension of a TEM line. Because a stripline is relatively wide, its circumferential dimensions are larger than that of a slab line. Consequently, the frequency converter with slab line can be used for operation at higher frequency than the frequency converter with a stripline. Since both are TEM lines, the conversion mechanism of the frequency converter is the same whether stripline or slab line is used for element 4, the only difference being that the cutoff frequency of a slab line is higher than the cutoff frequency of a stripline with the same outer conductor plates separation.

What I claim is:

1. A microwave frequency converter comprising: a rectangular waveguide through which a first radiofrequency wave may be propagated, said waveguide having first and second opposite pairs of walls with said first pair of walls being narrower than said second pair of walls; first and second coaxial transmission lines, each said line having an inner and an outer conductor; said outer transmission line conductors mounted upon and extending outwardly from said opposite first pair of walls of said waveguide; a conducting member, said member extending through the interior of said waveguide and joining said inner conductors of said transmission lines through apertures in said first walls of said waveguide; a pair of semiconductor diodes mounted on opposite sides of said member and electrically coupled between said opposite sides of said member and respective ones of said second pair of waveguide walls; means applying a second radiofrequency wave to said first transmission line, said first transmission line transmitting said second signal to said member; and a further wave conducting means coupled to said second transmission line, said second transmission line coupling signals between said member and said further wave conducting means.

2. A frequency converter as in claim 1 wherein said conducting member is in the form of a flat plate so that said conducting member and said second pair of waveguide walls form a strip transmission line.

3. A frequency converter as in claim 1 wherein said conducting member is cylindrical and said diodes are connected at diametrically opposed points on said conducting member so that said member and said second pair of waveguide walls form a slab transmission line.

4. A frequency converter as set forth in claim 1 wherein said semiconductor diodes are parallel with said first pair of waveguide walls and said conducting member provides an electrical short between one terminal of each of said diodes.